United States Patent
Reichel et al.

(10) Patent No.: US 8,504,315 B2
(45) Date of Patent: Aug. 6, 2013

(54) METHOD FOR THE SECONDARY ERROR CORRECTION OF A MULTI-PORT NETWORK ANALYZER

(75) Inventors: Thomas Reichel, Baldham (DE); Rolf Judaschke, Braunschweig (DE); Gerd Wuebbeler, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 142 days.

(21) Appl. No.: 12/814,697

(22) Filed: Jun. 14, 2010

(65) Prior Publication Data

US 2010/0318833 A1    Dec. 16, 2010

(30) Foreign Application Priority Data

Jun. 12, 2009 (DE) .................. 10 2009 024 751

(51) Int. Cl.
*G01D 18/00* (2006.01)
*G01R 31/00* (2006.01)
*G06F 11/00* (2006.01)

(52) U.S. Cl.
USPC ..................... 702/85; 324/750.02; 714/48

(58) Field of Classification Search
USPC ............ 702/85, 57–60, 66–67, 69, 75–76, 702/81, 84, 89–90, 107–108, 117, 124, 127, 702/182–183, 185, 189, 196; 714/1–2, 25, 714/37, 47.1, 48, 57, 699, 798–799, E11.023; 324/76.11–76.12, 500, 512, 522, 531, 533–534, 324/601, 620, 637–638, 642, 650, 750.02, 324/754.01, 754.03, 755.01, 756.05–756.06
See application file for complete search history.

(56) References Cited

FOREIGN PATENT DOCUMENTS

| DE | 39 12 795 A1 | 11/1989 |
|---|---|---|
| DE | 20 2004 013 305 U1 | 11/2004 |
| DE | 10 2006 008 063 A1 | 8/2007 |
| WO | WO 03/076956 A2 | 9/2003 |
| WO | WO 2007/096059 A1 | 8/2007 |

OTHER PUBLICATIONS

Judaschke et al., Second-Order Error Correction of a Calibrated Two-Port Vector Network Analyzer, Jun. 8, 2009, 73th ARFTG Conference Digest, 3 pp.*
Rytting, D., Improved RF Hardware and Calibration Methods for Network Analyzers, 1991, Hewlett Packard, RF & Microwave Measurement Symposium and Exhibition, 15 pp.*
Wubbeler et al., Determination of Complex Residual Error Parameters of a Calibrated Vector Analyzer, 2007 IEEE, 4 pp.*

(Continued)

*Primary Examiner* — Toan Le
(74) *Attorney, Agent, or Firm* — Ditthavong Mori & Steiner, P.C.

(57) ABSTRACT

A method for the error correction of a vectorial network analyzer, where a primary system calibration is initially implemented using a calibration kit. Following this, a first, secondary error correction is implemented on at least one one-port networks of the vectorial network analyzer. After this first, secondary error correction of the one-port networks of the vectorial network analyzer, a second, secondary error correction is implemented, where either two one-port networks are through-connected in an ideal manner or a measurement is implemented on a reciprocal two-port network. The corrected system-error values from the first, secondary error correction are used even in this further measurement, and overall, a high-precision, calibrated multi-port network analyzer is obtained.

18 Claims, 3 Drawing Sheets

(56) References Cited

OTHER PUBLICATIONS

Physikalisch—Technische Bundesanstalt (PTB) reference listing, Feb. 17, 2012, 19 pp.*

Physikalisch—Technische Bundesanstalt (PTB) reference listing, Feb. 17, 2012, 1 pp.*

M. Hiebel, "Grundlagen der vektoriellen Netzwerkanalyse," Rohde & Schwarz GmbH & Co. KG, 2005, Germany, pp. 136-142, 283-287.

* cited by examiner

METHOD FOR THE SECONDARY ERROR CORRECTION OF A MULTI-PORT NETWORK ANALYZER

CROSS-REFERENCE TO RELATED APPLICATION

The present application claims priority to German Application No. 10 2009 024 751.3, filed on Jun. 12, 2009, the entire contents of which are herein incorporated by reference.

BACKGROUND OF THE INVENTION

1. Field of the Invention

The invention relates to a method for the secondary error correction of a multi-port vector network analyzer.

2. Discussion of the Background

For the accurate measurement of complex-value scattering parameters with a vectorial network analyzer (VNA), it is initially necessary to implement a system calibration in the measurement planes of the network analyzer. The measurement planes are generally the ends of the test cables. A plurality of different calibration methods are known for this purpose. TOSM, TRL, LRL, LRM, which differ from one another with regard to the necessary calibration standards and the subsequent evaluation of the individual calibration measurements, can be named as examples. Dependent upon the calibration method and the number of test ports, a measurement of different calibration standards (open-circuit, short-circuit, broadband load, sliding load, (air-) lines, direct through-connection of the test ports) is carried out, from which a determination of the system error parameters is carried out. Using the system error parameters, a numerical error correction is performed in the subsequent measurement of the device under test. This is known, for example, from DE 39 12 795 A1.

After the completion of the error correction, the magnitude of the residual error parameters, which can also be denoted as effective system parameters, is primarily determined, in addition to the methodology of the calibration method and the care taken with the calibration procedure, through the accuracy of the description of the calibration standards, which the manufacturer of a calibration kit supplies to the user. With the introduction of electronic calibration kits, but also with the miniaturization of mechanical calibration standards associated with increasing measurement frequencies, the direct relation to the mechanical properties of the calibration standard has been lost, so that the user is fully dependent on the manufacturer's information. Thus, in addition to the system calibration by means of the named methods, a verification method is therefore often additionally applied, or a secondary calibration is implemented.

In order to estimate the measurement errors based on a potentially erroneous calibration in directive EA-10/12, it is proposed that the absolute value of the effective directivity and of the effective source can be determined by connecting a precision coaxial airline terminated by a mismatch and a short-circuit, respectively, in a defined manner at its output to the test port to be measured by the system-calibrated network analyzer. In order to determine the effective directivity and the effective source match, the magnitude of the reflection coefficient at the input of this air line is measured within the test frequency range. From the oscillations of the magnitude of the reflection coefficient observed in this test configuration, the oscillation amplitude (also referred to as the ripple amplitude) provides a measure for the absolute value of the effective directivity and the effective source match, respectively. However, this method provides only a relatively rough estimate of the effective system parameters, from which a re-correction cannot be performed.

An improved method compared to the above-described for determining the effective directivity and effective source match of the test port of a calibrated network analyzer which is improved is known from WO 03/076956 A2. This method is also based on the measurement of a precision air line short-circuited at the output-end and provides very accurate and moreover complex values for the effective directivity and effective source match, for every frequency point within the test frequency range. The values of the complex reflection coefficient measured within a fine frequency grid are numerically frequency-stuffed, extrapolated, inverse Fourier transformed, and the effective system parameters are extracted by low-pass filtering of the reflectometry signal obtained accordingly in the time-domain. With the determination of the complex-valued, effective directivity and source match, a re-correction can then be applied, and the measurement accuracy can therefore be increased. Furthermore, it is possible to determine the complex-valued effective reflection tracking and accordingly the third system parameter required for the complete description of one-port measurements.

The disadvantage with the known method is that a secondary error correction can only be applied to one-port network analyzers.

SUMMARY OF THE INVENTION

Accordingly, embodiments of the present invention advantageously provide a method for reducing the residual error in a multi-port vector network analyzer.

The present invention implements a method for secondary error correction of a multi-port network analyzer, wherein the correction comprises all system-error parameters between the test ports (in transmission), therefore also the correction of those additionally relevant in the case of a two-port measurement. As already explained, it is known that a determination of the effective source match and effective directivity and their secondary correction for all individual one-ports of a network analyzer can be implemented through the implementation of an air line measurement, the subsequent numerical determination of the effective directivity and of the effective source match and the accordingly possible calculation of their respectively corrected values separately at every port of the VNA. Starting from such a partial secondary error correction, according to the invention, a further measurement, this time between the individual VNA ports, is performed. In this context, either a through-connection (as ideal as possible) is established or a reciprocal network is inserted between the test ports. Both approaches have in common that a further measurement is performed with the system parameters of the one-port networks having already been subject to a partial secondary correction.

In case of an ideal through-connection, a secondary error correction is performed, which comprises a measurement of the scattering parameter matrix on at least one frequency point. From this scattering parameter matrix, an un-corrected scattering parameter matrix is determined, from which finally a corrected load match and/or a corrected transmission tracking is determined.

In the case of the reciprocal network, a transmission matrix is measured in order to determine the corrected transmission tracking.

Since a secondary one-port error correction has already been performed in each case with high precision before the measurement of the two-port network, a correction of the system error parameters relevant for the transmission measurement (load match, transmission tracking) can be performed with the measurement now to be implemented on the two-port network.

In particular, the determination of the scattering matrix or the transmission matrix in each case for all frequency points of a measurement range can be determined, for which corrected system parameters for the one-port networks are available. Moreover, in addition to the already described determination of the system parameters directivity and source-port match, it is also advantageous to determine the reflection tracking. For this purpose, a further measurement is performed according to the invention on a short-circuited or offset short-circuited air line.

It is particularly advantageous to perform the described second secondary error correction in pairs for different test ports, thereby calibrating the multi-port network analyzer as a whole in a high-precision manner.

BRIEF DESCRIPTION OF THE DRAWINGS

The invention is explained in more detail below with reference to schematic drawings and diagrams. The individual drawings are as follows.

DETAILED DESCRIPTION OF EXEMPLARY EMBODIMENTS OF THE INVENTION

Figure 1:
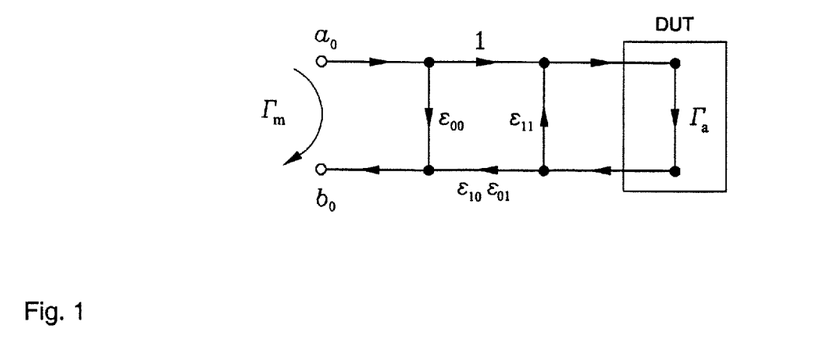
FIG. 1 shows the signal flow graph for an individual VNA test port.

In the mathematical description below, the meaning of the symbols used is as follows:
A directivity term
$a_0$ incident wave at port 1
$a'_3$ incident wave at port 2
$\alpha$ attenuation constant of the reference air line
B short-circuit term
$b_0$ reflected wave at port 1
$b'_0$ received wave at port 1
$b_3$ received wave at port 2
$b'_3$ reflected wave at port 2
C source-match term
c speed of light
$\epsilon_{00}$ effective directivity (residual directivity)
$e_{00}$ directivity
$\tilde{e}_{00}$ error-corrected directivity
$\epsilon_{11}$ effective source match (residual source match)
$e_{11}$ source match
$\tilde{e}_{11}$ error-corrected source match
$\epsilon_{10}\epsilon_{01}$ effective reflection tracking (residual reflection tracking)
$e_{10}e_{01}$ reflection tracking
$\tilde{e}_{10}\tilde{e}_{01}$ error-corrected reflection tracking
$e_{10}e_{32}$ transmission tracking
$\tilde{e}_{10}\tilde{e}_{32}$ error-corrected transmission tracking
$e_{22}$ load match in forward direction
$\tilde{e}_{22}$ error-corrected load match in forward direction
$\gamma$ propagation constant on the air line
$\Gamma_a$ actual reflection coefficient of the device under test (DUT)
$\Gamma_m$ measured reflection coefficient after the system-error correction
$\tilde{\Gamma}_m$ frequency-shifted, measured reflection coefficient
$\Gamma_a^{SC}$ model for the offset short-circuit
$\Gamma_m^{SC}$ measurement value of the offset short-circuit
$\lambda$ attenuation factor
L length of the air line including offset short-circuit line portion
$\Phi$ phase factor
$S_{ij}$ scattering parameters of the air line including offset short-circuit line portion
$[S_T]$ measured scattering matrix of a through-connection of two test ports
$[S_{T,raw}]$ raw value scattering matrix corresponding to the matrix $[S_T]$
$\omega$ angular frequency The signal flow diagram for the individual ports of a VNA as presented in FIG. 1 is initially assumed.

Accordingly, the measured reflection coefficient $\Gamma_m$ and the actual value $\Gamma_a$ for the reflection coefficient of the device under test (DUT) are related according to $$\Gamma_m = \frac{b_0}{a_0} = \varepsilon_{00} + (\varepsilon_{10}\varepsilon_{01})\frac{\Gamma_a}{1-\varepsilon_{11}\Gamma_a}. \tag{1}$$

As already mentioned, the reflection coefficients and the system parameters are complex-valued, frequency dependent values. On the assumption that the effective system error parameters are small, i.e., a primary calibration of the VNA has already been performed, equation (1) can be approximated by $$\Gamma_m \approx \varepsilon_{00} + (\varepsilon_{10}\varepsilon_{01})\Gamma_a + \varepsilon_{11}(\varepsilon_{10}\varepsilon_{01})\Gamma_a^2 \tag{2}.$$

Figure 2:
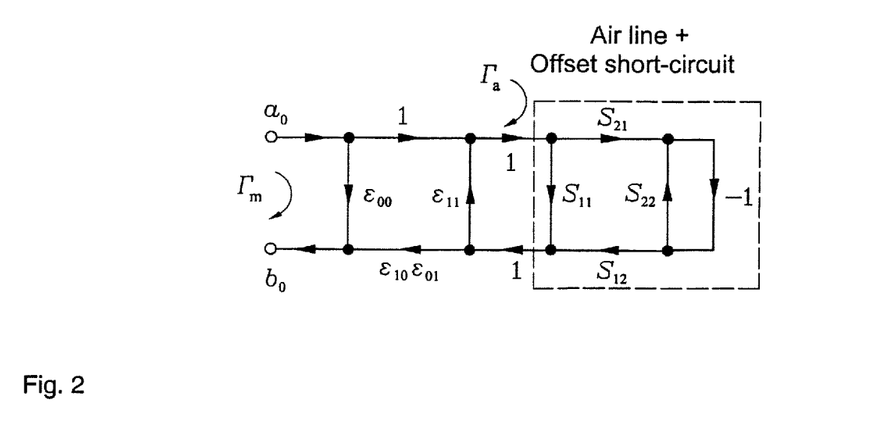
FIG. 2 shows the signal flow graph for a VNA test port, which is terminated by an air line short-circuited at the output.

FIG. 2 shows the signal flow graph for the measurement to be performed after the primary calibration for the first, secondary error correction on the one-port networks, in which an air line short-circuited at the output end is connected to the test port, wherein the short-circuit is generally performed as an offset short-circuit. The wave propagation on the air line including offset short-circuit can be described by the complex propagation constant $$\gamma = \alpha + j\frac{\omega}{c}, \tag{3}$$

wherein the attenuation constant is assumed to be small compared with the phase constant. Moreover, ideal cross-sectional dimensions for the air line are assumed, so that the following applies for their reflection scattering parameters $$S_{11} = S_{22} = 0 \tag{4}$$

and their input reflection coefficient can be approximated by $$\Gamma_a \approx -S_{21}S_{12} = -e^{-2\gamma L} = -\lambda e^{-j2\omega L/c} \tag{5}.$$

The factor $$\lambda = e^{-2\alpha L} \tag{6}$$

describes the small attenuation losses on the air line or respectively the offset short-circuit.

By inserting (5) into (2), the following is obtained for the measured reflection coefficients:

$$\Gamma_m \approx \underbrace{\varepsilon_{00}}_{A} - \underbrace{(\varepsilon_{10}\varepsilon_{01})\lambda e^{-j2\omega L/c}}_{B} + \underbrace{\varepsilon_{11}(\varepsilon_{10}\varepsilon_{01})\lambda^2 e^{-j4\omega L/c}}_{C}, \quad (7)$$

of which the summands can be assigned to the effective directivity (A), to a short-circuit term (B) and to source-port match term (C).

Figure 3:
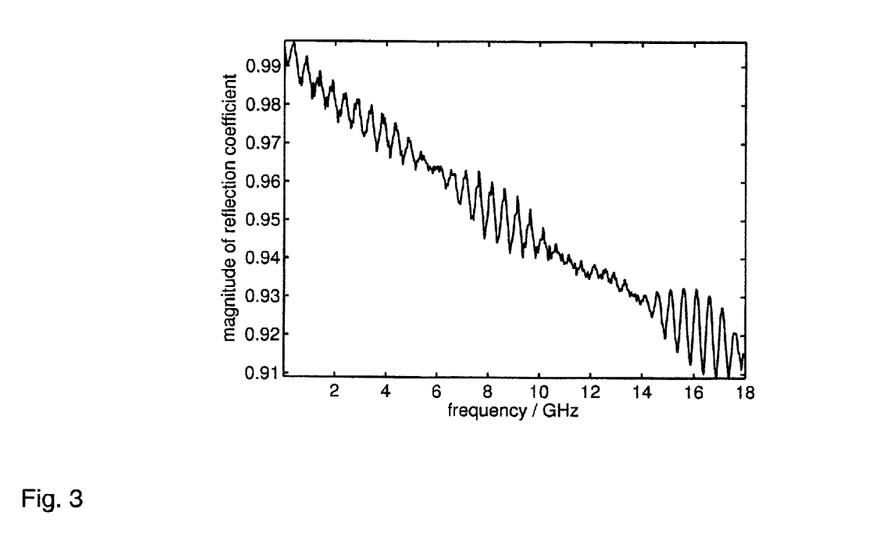
FIG. 3 shows a measured magnitude $|\Gamma_m|$ of the input reflection coefficient of an air line short-circuited at the end.

It is evident that the measured reflection coefficient of a short-circuited air line provides phase displacements $-2\omega L/c$ and $4\omega L/c$ rising in a linear manner with frequency. While the directivity term (A) remains unchanged, the short-circuit term (B) is modulated with double, and the source-port match term (C) with four-times the phase displacement caused by the propagation of the electromagnetic wave on the air line. These frequency dependencies deviating from each other by a factor of two cause the typical oscillations in the magnitude of the reflection coefficient $|\Gamma_m|$ in case of a VNA calibrated in a non-ideal manner, as shown in FIG. 3.

If the length of the air line does not fall below a minimum dimension, the Fourier transform of the test signal $\Gamma_m$ shows the characteristic presented in FIG. 4 in the time domain, in which three mutually separated, characteristic maxima are recognizable, which can be assigned to the terms (A), (B) and (C).

Figure 4:
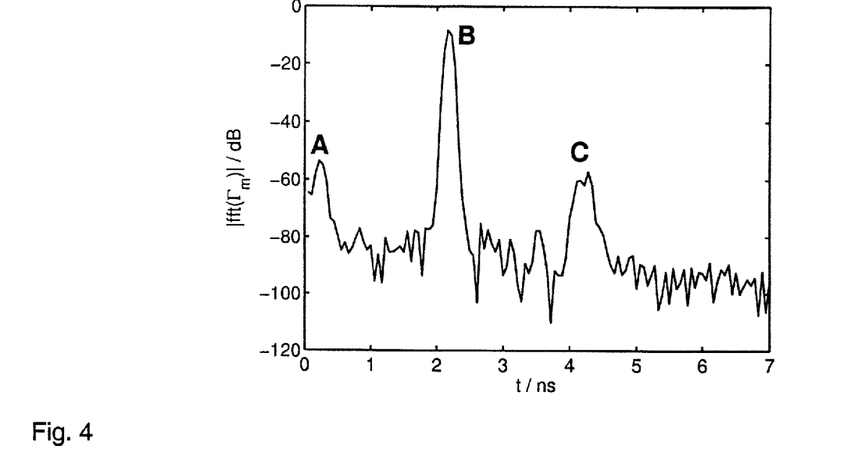
FIG. 4 shows a Fourier transform of the test signal $\Gamma_m$ according to FIG. 3 with characteristic maxima.

It is assumed that the frequency dependence of the residual error terms is slow compared to the phase factor $$\Phi := e^{-j2\omega L/c} \quad (8)$$

and accordingly, an extraction of the characteristic maxima in FIG. 4 is possible by filtering in the time-domain. Since a low-pass filtering with a fixed filter bandwidth is appliable with the method due to the equidistant spacing of the partial reflections in the time-domain, a numerical downward mixing through division in each case by integer multiples of the phase factor $\Phi$ is implemented before performing the time-domain transformation. After low-pass filtering, a back-transformation into the frequency-domain is performed with subsequent upward mixing through multiplication by the phase factor $\Phi$.

Explicit reference is made to details of the determination of the effective source match and of the effective directivity of a one-port network, as described in WO 03/076956 A2. However, the determination of the residual reflection tracking ($\delta_{10}\epsilon_{01}$) should be additionally implemented here, and accordingly, the determination of all residual reflection terms is explained below. For this purpose, the test signal is numerically extrapolated at both ends of the measurement-frequency range prior to the time-domain transformation by linear prediction, which is performed with the present method in the same manner as in WO 03/076956 A2 and will not be described again here.

The determination of the terms (A), (B) and (C) in equation (7) begins with the largest component (B) with regard to absolute value by implementing a numerical downward mixing into the baseband according to $$\tilde{\Gamma}_m = \Gamma_m / \Phi \approx \varepsilon_{00} e^{j2\omega L/c} - (\varepsilon_{10}\varepsilon_{01})\lambda + \varepsilon_{11}(\varepsilon_{10}\varepsilon_{01})\lambda^2 e^{-j2\omega L/c}. \quad (9)$$

After $\tilde{\Gamma}_m$ has been extrapolated according to the above method, a low-pass filtering of $(\epsilon_{10}\epsilon_{01})\lambda$ in the time-domain is performed, from which the term (B) is obtained after back-transformation into the frequency-domain and inverse frequency shifting. Since the attenuation factor $\lambda$ is not known with sufficient precision, the residual reflection tracking ($\epsilon_{10}\epsilon_{01}$) cannot be determined directly. However, the term (B) is required for the further calculation. In the next step, the term (A), that is, the residual directivity $\epsilon_{00}$, is determined by low-pass filtering of $$\Gamma_m - B \approx A + C = \epsilon_{00} + \epsilon_{11}(\epsilon_{10}\epsilon_{01})\lambda^2 e^{-j4\omega L/c} \quad (10).$$

For the calculation of the term (C), equation (10) is converted according to $$\frac{\Gamma_m - B}{B^2} \approx \frac{A}{B^2} + \frac{C}{B^2} = \frac{\varepsilon_{00}}{(\varepsilon_{10}\varepsilon_{01})^2 \lambda^2} e^{j4\omega L/c} + \frac{\varepsilon_{11}}{(\varepsilon_{10}\varepsilon_{01})} \quad (11)$$

and once again, the scheme of extrapolation, time-domain transformation and low-pass filtering is applied. In this context, not only the phase shift $\Phi^2$ is eliminated, but also the unknown attenuation factor $\lambda^2$. The expression $$\frac{C}{B^2} = \frac{\varepsilon_{11}}{(\varepsilon_{10}\varepsilon_{01})} \quad (12)$$

obtained from this in the frequency-domain, neglecting the residual reflection tracking (($\epsilon_{10}\epsilon_{01}$)≈1), is equal to the sought residual source match.

The hitherto unknown residual reflection tracking ($\epsilon_{10}\epsilon_{01}$) is determined through an additional measurement of an offset short-circuit. In fact, according to equation (1), between the measurement value $\Gamma_m^{SC}$ and the model $\Gamma_a^{SC}$ of the offset short-circuit obtained from numerical simulations, the relationship $$\Gamma_m^{SC} = \varepsilon_{00} + (\varepsilon_{10}\varepsilon_{01}) \frac{\Gamma_a^{SC}}{1 - \varepsilon_{11}\Gamma_a^{SC}} \quad (13)$$

must be fulfilled. Accordingly, the following is obtained for the residual reflection tracking $$(\varepsilon_{10}\varepsilon_{01}) = \left(\frac{C}{B^2}\Gamma_{a^*}^{SC} + \frac{\Gamma_a^{SC}}{\Gamma_m^{SC} - A}\right)^{-1}. \quad (14)$$

With the knowledge of the complex reflection tracking, the residual source match $\epsilon_{11}$ according to equation (12) can be determined more accurately.

Knowing the complex-valued residual error parameters (directivity $\epsilon_{00}$, source match $\epsilon_{11}$ and the reflection tracking ($\epsilon_{10}\epsilon_{01}$)) for every measurement frequency point, a secondary error correction can be performed at every test port of the VNA. The corrected system error parameters are calculated from the error parameters previously obtained through the primary system calibration and the now known, complex residual error parameters as follows:

$$\tilde{e}_{00} e_{00} + (e_{10} e_{01}) \frac{\varepsilon_{00}}{1 - e_{11}\varepsilon_{00}} \quad (15)$$

$$\tilde{e}_{11} = \varepsilon_{11} + (\varepsilon_{10}\varepsilon_{01}) \frac{e_{11}}{1 - e_{11}\varepsilon_{00}} \quad (16)$$

-continued $$\tilde{e}_{10}\tilde{e}_{01} = (\varepsilon_{10}\varepsilon_{01})\frac{e_{10}e_{01}}{(1-e_{11}\varepsilon_{00})^2} \quad (17)$$

Starting from the corrected one-port system error parameters, an additional secondary correction is implemented according to the invention by means of two-port and/or multiple-port measurements. In the following section, this is described by way of example for a two-port network analyzer. Generalization for additional ports is made in an analogous manner by considering all VNA ports respectively in pairs.

Figure 5:
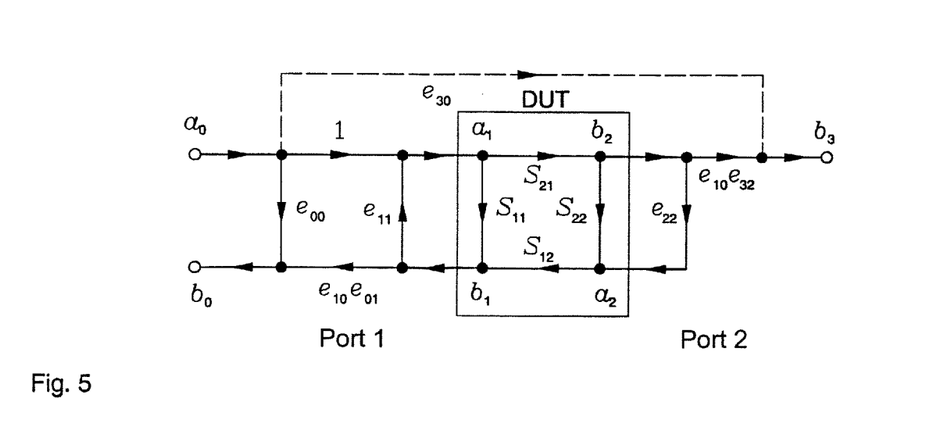
FIG. 5 shows the 12-term system error model of a 2-port vector network analyzer in forward direction.
Figure 6:
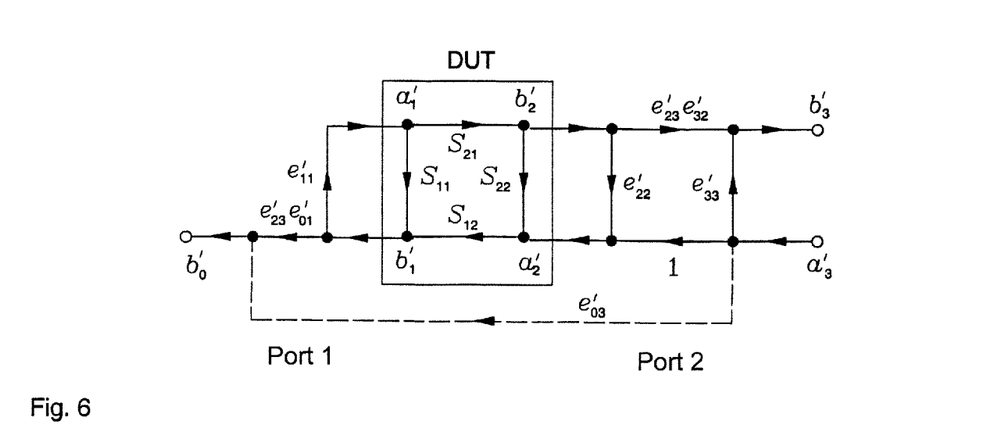
FIG. 6 shows the 12-term system error model of a 2-port vector network analyzer in reverse direction.

The signal flow graph of the 12-term error model of a two-port vector network analyzer in forward direction, illustrated in FIG. 5, which has to be extended by six system parameters compared with the one-port measurement, is initially considered. In the forward direction, this involves the load match $e_{22}$, the transmission tracking ($e_{10}e_{32}$) and the crosstalk $e_{30}$. In the reverse direction (FIG. 6), corresponding parameters are considered. It is assumed that the crosstalk in forward and reverse directions is negligible, which, without restricting generality, is fulfilled for modern network analyzers. After performing a two-port calibration by applying a standard 12-term calibration method (for example, SOLT) or by means of an electronic calibration unit, the determination of the effective directivity, effective source match, and the effective reflection tracking is performed in a first step as described above. With knowledge of the effective one-port system parameters, values for the corrected one-port system parameters at every port are calculated according to equations (15)-(17) over. Subsequently, the corresponding memory registers of the network analyzer are overwritten. By contrast, the two transmission parameters remain unchanged.

With the network analyzer being partially secondary-error corrected, an additional measurement of the ideal through-connection of the two test ports is performed. The result is a two-port scattering matrix $$[S_T] = \begin{bmatrix} S_{T,11} & S_{T,12} \\ S_{T,21} & S_{T,22} \end{bmatrix} \quad (18)$$

from which, using the partially corrected system error parameters, the uncorrected scattering matrix or raw-value scattering matrix $[S_{T,raw}]$ is calculated, which is defined as follows:

$$[S_{T,raw}] = \begin{bmatrix} \dfrac{b_0}{a_0} & \dfrac{b'_0}{a'_3} \\ \dfrac{b_3}{a_0} & \dfrac{b'_3}{a'_3} \end{bmatrix} \quad (18a)$$

Assuming that the measurement of the through-connection in case of a perfectly system-error-corrected network analyzer, has to result in the theoretical values, i.e., $S_{T,11}=S_{T,22}=0$ and $S_{T,21}=S_{T,12}=1$, the corrected system parameters for the load-port match and transmission tracking can be calculated according to $$\tilde{e}_{22} = \frac{S_{T,raw,11} - \tilde{e}_{00}}{\tilde{e}_{10}\tilde{e}_{01} + \tilde{e}_{11}(S_{T,raw,11} - \tilde{e}_{00})} \quad (19)$$

$$(\tilde{e}_{10}\tilde{e}_{32}) = S_{T,raw,21}(1 - \tilde{e}_{11}\tilde{e}_{22}). \quad (20)$$

The determination of the corrected parameters in the reverse direction is performed accordingly. It should be noted that no explicit determination of the effective system parameters in the forward direction is performed. Instead, a direct correction of the absolute system parameters "load-port match" and "transmission tracking" is carried out. By measuring all through-connections of a multi-port network analyzer, of which the one-port parameters have previously been subjected to a secondary-error correction, a complete correction can be performed by applying equations (19) and (20).

Figure 7:
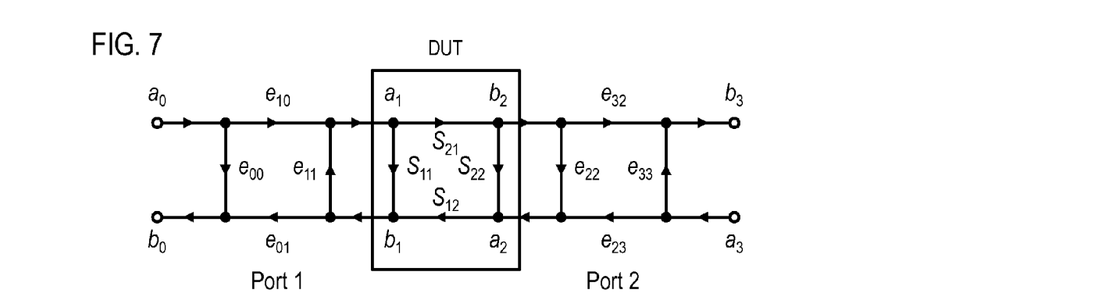
FIG. 7 shows the 8-term system error model of a vectorial 2-port network analyzer.

As an alternative, the described secondary error correction scheme can be applied based on the 8-term error model as well (FIG. 7), especially to the UOSM method (also referred to as "unknown thru" method). In contrast to the 12-term SOLT calibration method, instead of the through-connection, an unknown reciprocal two-port network is measured, from which the seventh model parameter is determined knowing the one-port parameters (directivity, source-port match and reflection tracking). Based on the network topology, the relation between the measured and the actual scattering parameters is established by a transmission-matrix formulation via the cascading of three 2-port matrices. The following relationship between the measured transmission matrix $[T_m]$ and the transmission matrix $[T]$ of the device under test is then obtained:

$$[T_m]=[T_1][T][T_2] \quad (21)$$

with $$[T_1] = \frac{1}{e_{10}}\begin{bmatrix} -(e_{00}e_{11}+e_{10}e_{01}) & e_{00} \\ -e_{11} & 1 \end{bmatrix} = \frac{1}{e_{10}}[A] \quad (22)$$

$$[T_2] = \frac{1}{e_{32}}\begin{bmatrix} -(e_{22}e_{33}+e_{32}e_{23}) & e_{22} \\ -e_{33} & 1 \end{bmatrix} = \frac{1}{e_{32}}[B]. \quad (23)$$

The matrix elements in equations (22) and (23) refer to the one-port parameters at the two ports, while the product ($e_{10}e_{32}$) is obtained from the measurement of the reciprocal two-port network. According to the invention, once again, a first secondary error correction of the reflection parameters is also performed at both test ports in a similar manner, and their corrected values are updated in the VNA. The missing parameter of the transmission tracking is then calculated from $$\frac{1}{e_{10}e_{32}} = \pm\sqrt{\frac{\det[A]\det[B]}{\det[T_m]}}. \quad (24)$$

Since only already secondary corrected system parameters are included in the right-hand side of equation (24) in addition to the measured transmission matrix of the unknown through-connection, the determination of the missing parameter is also performed with very high accuracy.

The complete secondary correction of all system parameters by means of the method according to the invention leads to a reduction of the measurement error in both forward and or reverse directions by reducing the residual error terms in the transmission direction. Regarding the value of these residual error terms, the user has no information after a VNA calibration performed in a regular manner; he must rely on the information from the manufacture of conventional or electronic calibration kits, wherein relatively coarse estimates are generally specified. A further advantage of the method is that, through its application, the test engineer obtains information regarding the quality of the previously performed, conventional system calibration and therefore regarding the quality of the used calibration kit. This is of great importance, because, especially at high-frequencies, the characterization of the calibration kit standards is based only on simulation data assuming that the real physical properties of the calibration standard are modelled correctly. Accordingly, the present method can also be regarded as a verification method and is furthermore suitable as a method for characterizing calibration standards more accurately. The latter point is important in the context of manufacturers' characterization of electronic calibration units, in which the switching states of the unit are measured by means of a high-precision calibrated VNA. If the latter were to be subjected to a secondary calibration by means of the present method, this would result in a reduced measurement uncertainty attainable with an electronic calibration unit.

FIG. 8 once again shows a simplified method flow chart. Initially, the vectorial network analyzer is subjected to primary calibration (Step S1) by using a conventional or an electronic calibration kit. After the implementation of the primary calibration in step S1, their residual one-port system-error parameters are determined at each port (S2). Subsequently, the corrected system-error parameters are calculated in step S3 and the corresponding memory registers of the vectorial network analyzer are updated. As a result, a first secondary correction of the system error parameters, which relate to the one-port networks of the VNA, has been performed. The subsequent, second secondary correction can be performed according to the simplified method flow chart illustrated on the left or on the right in FIG. 8.

Figure 8:
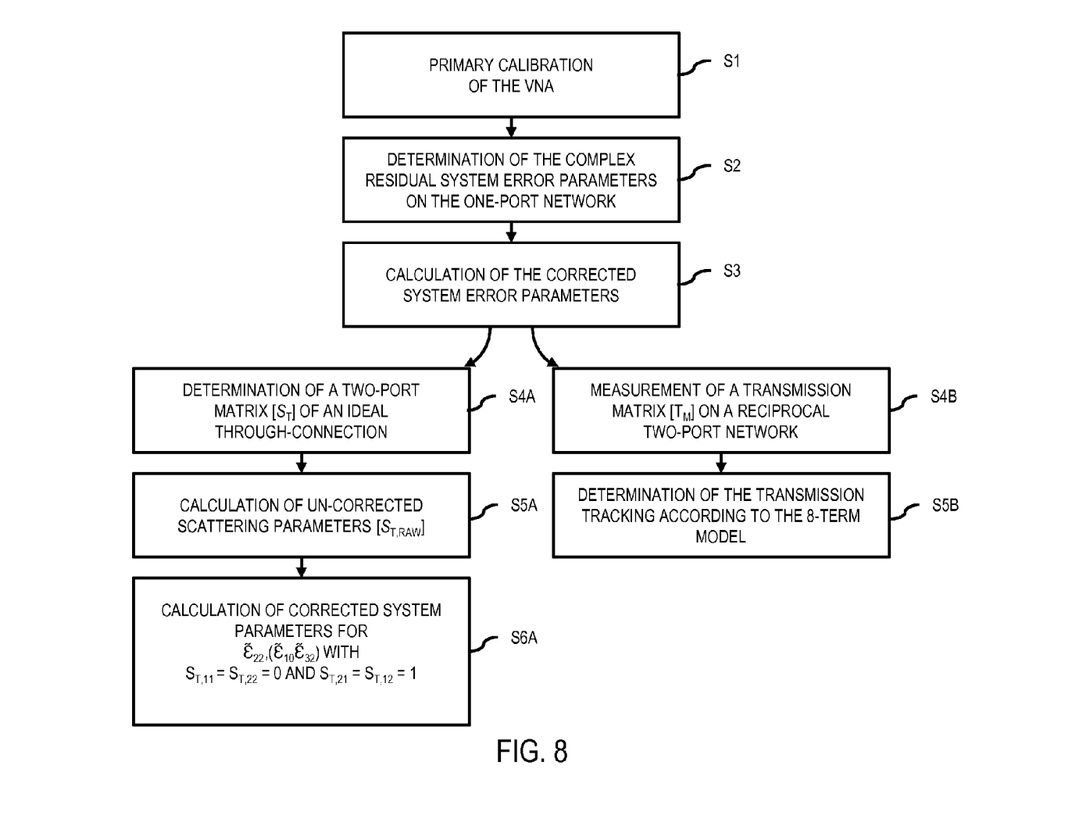
FIG. 8 shows a simplified method flow-chart of the method according to the invention.

In case of the measurement of an ideal through-connection of the respective test ports of the network analyzer, a two-port scattering matrix $[S_T]$ is determined in step S4A. From the two-port scattering matrix ($S_T$) and the system errors already partially corrected on the basis of the first secondary correction, an uncorrected scattering matrix $[S_{T,raw}]$ is calculated in step S5A from the determined two-port scattering matrix. Following this, a correction of the absolute system parameters "load-port match" and "transmission tracking" is then directly performed in step S6A from the un-corrected scattering matrix $[S_{T,raw}]$.

As an alternative, after the calculation of the corrected system-one-port-error parameters in S3, a reciprocal two-port network and its transmission matrix $[T_m]$ can be determined (step S4B). Based on the eight-term error model and the UOSM calibration method, the transmission tracking is then determined (step S5B).

The detailed method steps and the mathematical relationships have already been explained in detail above, and a repetition of this description will not be carried out at this point.

Reference is made to the fact that the above description is based upon the assumption that, for the one-port networks, corrected system-error parameters for the directivity, the source-port match and the reflection synchronization are available or determined. However, the method according to the invention can be used, even if only one of these corrected system-error parameters is available or determined, wherein reductions in the quality of the results must then, of course, be made.

The invention claimed is:
1. A method for error correction of a vector network analyzer with at least two test ports, with the following method steps:
performing a primary system calibration using a calibration kit,
performing, via at least one processor, a first secondary error correction on relevant one-port networks of the vector network analyzer,
performing, via the at least one processor, a second secondary error correction,
wherein,
after the first secondary error correction of at least two one-port networks and a determination of at least one of system parameters directivity, source match and reflection tracking on the one-port networks, the second secondary error correction is performed, wherein, for this purpose, the at least two one-port networks are through connected in an ideal manner and, taking into consideration system-error parameter(s) of the first secondary error correction for at least one frequency point of the test-frequency range, a scattering parameter matrix is measured, from this, an un-corrected scattering parameter matrix is determined and, from this, a corrected load match and/or a corrected transmission tracking in a forward and/or a reverse direction is determined.

2. The method according to claim 1,
wherein the measurement of the scattering parameter matrix is performed for every frequency point of a measurement range.

3. The method according to claim 2,
wherein an effective directivity and the effective source match is initially determined for each one-port network from a frequency-dependent measurement of the complex reflection coefficient of an air line short-circuited at its end and, following this, an effective reflection tracking is determined by measuring an offset short-circuit or short-circuit for each frequency point of the test-frequency range as a complex value on each one-port network.

4. The method according to claim 1,
wherein an effective directivity and the source match is initially determined for each one-port network from a frequency-dependent measurement of the complex reflection coefficient of an air line short-circuited at its end and, following this, an effective reflection tracking is determined by measuring an offset short-circuit or short-circuit for each frequency point of the test-frequency range as a complex value on each one-port network.

5. A method for the error correction of a vectorial network analyzer with at least one two-port network, with the following method steps:
performing of a primary system calibration using a calibration kit,
performing, via at least one processor, of a first secondary error correction on at least two one-port networks of the vectorial network analyzer,
performing, via the at least one processor, a second secondary error correction
wherein,
after the first secondary error correction of the at least two one-port networks and a determination of at least one of system parameters directivity, source match and reflection tracking on the one-port networks, the second secondary error correction is performed, wherein, for this purpose, a measurement is performed on a reciprocal two-port network and, a transmission matrix is determined from the measurement on the reciprocal two-port network in order to determine a corrected transmission tracking.

6. The method according to claim 5,
wherein an effective directivity and the effective source match is initially determined for each one-port network from a frequency-dependent measurement of the complex reflection coefficient of an air line short-circuited at its end and, following this, an effective reflection tracking is determined by measuring an offset short-circuit or short-circuit for each frequency point of the test-frequency range as a complex value on each one-port network.

7. An apparatus for error correction of a vectorial network analyzer with at least two test ports, comprising at least one processor; and
   at least one memory including computer program instructions stored as program code thereon,
   the at least one memory and the computer program code configured to, with the at least one processor, cause the apparatus to perform at least the following:
   performing a primary system calibration using a calibration kit,
   performing a first secondary error correction on relevant one-port networks of the vectorial network analyzer, and
   performing a second secondary error correction,
   wherein,
   after the first secondary error correction of at least two one-port networks and a determination of at least one of system parameters directivity, source match and reflection tracking on the one-port networks, the second secondary error correction is performed, wherein, for this purpose, the at least two one-port networks are through connected in an ideal manner and, taking into consideration system-error parameter(s) of the first secondary error correction for at least one frequency point of the test-frequency range, a scattering parameter matrix is measured, from this, an un-corrected scattering parameter matrix is determined and, from this, a corrected load match and/or a corrected transmission tracking in a forward and/or a reverse direction is determined.

8. The apparatus according to claim 7,
   wherein the measurement of the scattering parameter matrix is performed for every frequency point of a measurement range.

9. The apparatus according to claim 8,
   wherein an effective directivity and the effective source match is initially determined for each one-port network from a frequency-dependent measurement of the complex reflection coefficient of an air line short-circuited at its end and, following this, an effective reflection tracking is determined by measuring an offset short-circuit or short-circuit for each frequency point of the test-frequency range as a complex value on each one-port network.

10. The apparatus according to claim 7,
    wherein an effective directivity and the effective source match is initially determined for each one-port network from a frequency-dependent measurement of the complex reflection coefficient of an air line short-circuited at its end and, following this, an effective reflection tracking is determined by measuring an offset short-circuit or short-circuit for each frequency point of the test-frequency range as a complex value on each one-port network.

11. An apparatus for the error correction of a vectorial network analyzer with at least one two-port network, comprising at least one processor; and
    at least one memory including computer program instructions stored as program code thereon,
    the at least one memory and the computer program code configured to, with the at least one processor, cause the apparatus to perform at least the following:
    a primary system calibration using a calibration kit,
    a first secondary error correction on at least two one-port networks of the vectorial network analyzer, and
    a second secondary error correction
    wherein,
    after the first secondary error correction of the at least two one-port networks and a determination of at least one of system parameters directivity, source match and reflection tracking on the one-port networks, the second secondary error correction is performed, wherein, for this purpose, a measurement is performed on a reciprocal two-port network and, a transmission matrix is determined from the measurement on the reciprocal two-port network in order to determine a corrected transmission tracking.

12. The apparatus according to claim 11,
    wherein an effective directivity and the effective source match is initially determined for each one-port network from a frequency-dependent measurement of the complex reflection coefficient of an air line short-circuited at its end and, following this, an effective reflection tracking is determined by measuring an offset short-circuit or short-circuit for each frequency point of the test-frequency range as a complex value on each one-port network.

13. A system for error correction of a vectorial network analyzer with at least two test ports, comprising:
    a calibration kit for performing a primary system calibration,
    relevant one-port networks of the vectorial network for performing a first secondary error correction, and
    at least one processor for performing a second secondary error correction,
    wherein,
    after the first secondary error correction of at least two one-port networks and a determination of at least one of system parameters directivity, source match and reflection tracking on the one-port networks, the second secondary error correction is performed, wherein, for this purpose, the at least two one-port networks are through connected in an ideal manner and, taking into consideration system-error parameter(s) of the first secondary error correction for at least one frequency point of a test-frequency range, a scattering parameter matrix is measured, from this, an uncorrected scattering parameter matrix is determined and, from this, a corrected load match and/or a corrected transmission tracking in a forward and/or a reverse direction is determined.

14. The system according to claim 13,
    wherein the measurement of the scattering parameter matrix is performed for every frequency point of a measurement range.

15. The system according to claim 14,
    wherein an effective directivity and the effective source match is initially determined for each one-port network from a frequency-dependent measurement of the complex reflection coefficient of an air line short-circuited at its end and, following this, an effective reflection tracking is determined by measuring an offset short-circuit or short-circuit for each frequency point of the test-frequency range as a complex value on each one-port network.

16. The system according to claim 13,
    wherein an effective directivity and the effective source match is initially determined for each one-port network from a frequency-dependent measurement of the complex reflection coefficient of an air line short-circuited at its end and, following this, an effective reflection tracking is determined by measuring an offset short-circuit or short-circuit for each frequency point of the test-frequency range as a complex value on each one-port network.

17. A system for the error correction of a vectorial network analyzer with at least one two-port network, comprising:
   a calibration kit for performing a primary system calibration,
   at least one processor for performing a first secondary error correction on at least two one-port networks of the vectorial network analyzer, and
   the at least one processor for performing a second secondary error correction,
   wherein,
   after the first secondary error correction of the at least two one-port networks and a determination of at least one of system parameters directivity, source match and reflection tracking on the one-port networks, the second secondary error correction is performed, wherein, for this purpose, a measurement is performed on a reciprocal two-port network and, a transmission matrix is determined from the measurement on the reciprocal two-port network in order to determine a corrected transmission tracking.

18. The system according to claim 17,
   wherein an effective directivity and the effective source match are initially determined for each one-port network from a frequency-dependent measurement of the complex reflection coefficient of an air line short-circuited at its end and, following this, an effective reflection tracking is determined by measuring an offset short-circuit or short-circuit for each frequency point of the test-frequency range as a complex value on each one-port network.

* * * * *